United States Patent [19]

Noble, Jr. et al.

[11] 4,222,816
[45] Sep. 16, 1980

[54] METHOD FOR REDUCING PARASITIC CAPACITANCE IN INTEGRATED CIRCUIT STRUCTURES

[75] Inventors: Wendell P. Noble, Jr., Milton, Vt.; Richard A. Unis, Poughkeepsie, N.Y.

[73] Assignee: International Business Machines Corporation, Armonk, N.Y.

[21] Appl. No.: 973,219

[22] Filed: Dec. 26, 1978

[51] Int. Cl.² .................. H01L 21/225; H01L 21/308
[52] U.S. Cl. ........................... 156/643; 29/571; 29/578; 29/580; 148/187; 148/188; 156/656; 156/657; 156/662; 156/668; 156/659.1; 430/313
[58] Field of Search ................ 148/187, 188; 156/643, 156/649, 652, 653, 656, 657, 659, 662, 664, 668; 29/571, 578, 580; 96/67, 86 P; 427/86, 93

[56] References Cited
U.S. PATENT DOCUMENTS

| | | | |
|---|---|---|---|
| 3,841,926 | 10/1974 | Garnache et al. | 148/188 |
| 3,975,220 | 8/1976 | Quinn et al. | 148/187 |
| 3,976,524 | 8/1976 | Feng | 427/93 |
| 4,025,411 | 5/1977 | Hom-Ma | 156/656 |
| 4,045,594 | 8/1977 | Maddocks | 156/653 |
| 4,070,501 | 1/1978 | Corbin et al. | 427/88 |

OTHER PUBLICATIONS

Kruggel et al., "Low Capacitance Semiconductor . . . Profile," *IBM Technical Disclosure Bulletin*, vol. 17, No. 1, (6/74), p. 18.
Spencer, "Smoothing . . . Surfaces," *IBM Technical Disclosure Bulletin*, vol. 20, No. 11B, (4/78), 4842–4843.
Garnache, "Insulated Gate . . . Structure," *IBM Technical Disclosure Bulletin*, vol. 17, No. 1, (6/74), p. 17.
Garnache, "Method . . . Lines," *IBM Technical Disclosure Bulletin*, vol. 19, No. 7, (12/76), 2471–2472.

*Primary Examiner*—Jerome W. Massie
*Attorney, Agent, or Firm*—Howard J. Walter, Jr.

[57] ABSTRACT

A method for reducing parasitic capacitance in semiconductor devices, particularly for the removal of raised portions of conductive layers overlying and capable of being capacitively coupled to other conductors in semiconductor memory integrated circuits. The method provides for the application of a masking or photoresist layer over the surface of a substrate containing portions of a conductor to be removed such that the masking layer completely covers the conductor. Next a uniform thickness of the masking layer is removed to expose only the raised portions of the conductor which are subsequently selectively etched through the remainder of the masking layer. Application of the method to a manufacturing process for a dynamic MOSFET memory array is also described in which bit sense line capacitance is substantially reduced.

10 Claims, 11 Drawing Figures

METHOD FOR REDUCING PARASITIC CAPACITANCE IN INTEGRATED CIRCUIT STRUCTURES

BACKGROUND OF THE INVENTION

1. Field of the Invention

This invention relates to techniques for reducing parasitic capacitance in integrated circuits, and more particularly to a method of reducing parasitic bit line capacitance in a semiconductor memory circuit as influenced by capacitive coupling between a diffused bit line and overlying conductors.

2. Description of the Prior Art

U.S. Pat. Nos. 3,811,076 to W. M. Smith, Jr., issued May 14, 1974, and 3,841,926 to R. R. Garnache et al, issued Oct. 15, 1974, relate to a process and device structure for fabricating dynamic MOSFET memory cells including the use of a doped-oxide diffusion source and a conductive polysilicon field shield. U.S. Pat. No. 3,841,926 describes the structure for an array of single transistor/capacitor memory cells, as described in U.S. Pat. No. 3,387,286 to R. H. Dennard, which includes a polysilicon field shield spaced from an underlying diffused bit line by relatively thin dielectric layer of silicon dioxide and silicon nitride which also forms the gate dielectric of the transistor. Efforts to provide high density memory chips require that a minimum memory cell size be designed which is compatible with the minimum useful signal strength capable of being reliably detected by sensing circuitry. Detectable signal strength is a function of the size of the storage capacitor, applied voltages and the capacitance of the bit sense lines. In the design of such memory arrays the ratio of the effective capacitance of a bit sense line to that of a single storage cell, referred to as the transfer ratio, has a significant influence on the performance of the memory. Although it is preferable to have a low transfer ratio, it is difficult to reduce the capacitance of the bit sense line effectively. In designs using a diffused bit line, parasitic capacitance includes the junction capacitance of the bit sense line and the capacitance between the diffused line and adjacent insulated conductive electrodes. Various techniques have been previously proposed to reduce the bit sense line to conductive lead capacitance ratio. One technique retains the relatively thick doped oxide over bit line diffusions which effectively reduces the capacitance by increasing the distance between the capacitor plates. Another method of controlling undesired capacitance is to carefully control the etch bias characteristics of the doped oxide diffusion source to reduce the area of overlap capacitance along the edges of the bit diffusion, as described in U.S. Pat. No. 3,975,220. The last mentioned technique has limitations in that the same capacitance characteristics are created for all diffusions on the chip and the effective reduction in capacitance near the junction edges is only a small percentage of the total capacitance of the diffused region. Other capacitance reduction techniques include selectively exposing the portions of the conductors overlying diffusions and thermally oxidizing the conductor (see *IBM Technical Disclosure Bulletin*, June 1974, page 18), or providing a non-conductive intrinsic polysilicon layer which is rendered conductive only in selective areas by adding conductivity type impurities to those regions desired to be conductive (see *IBM Technical Disclosure Bulletin*, June 1974, page 17). Such techniques are not preferred because they add the requirement of another mask and alignment step to an already mask alignment sensitive process. What is required is a mask alignment insensitive technique for eliminating the presence of large areas of conductive material passing over the diffused bit lines. Such a process is provided by the invention herein described in which raised portions of a conductive layer are selectively removable by a technique easily adaptable to a manufacturing environment.

Additional related prior art includes the *IBM Technical Disclosure Bulletin* articles to R. R. Garnache and to O. S. Spencer found in the December 1976 issue, at pages 2471–2, and the April 1978 issue, at pages 4842–3. Both of these references teach the use of a self-leveling photoresist in conjunction with an ion implantation technique which by providing various levels of doping in an irregular surface layer causes different etching rates to be present in the layer after the photoresist is removed such that a somewhat selective or differential etching process removes higher, more heavily doped, regions of the layer at a faster rate than lower, lighter doped, regions. Etching techniques in which a layer of a single material having two different etching rates is etched without the presence of a substantially non-etchable mask are not preferred in semiconductor manufacturing because the end point of the etching step is somewhat arbitrary and therefore difficult to detect.

In addition, various other surface layer etching techniques have been previously described, each has limitations when applied to a manufacturing process which is sensitive to the introduction of additional mask aligning and processing steps, particularly when their implementation requires different materials or operations not already a part of the manufacturing process. For example, U.S. Pat. No. 3,976,524 to B. C. Feng, issued Aug. 24, 1976, teaches a planarization process which requires the use of a patterned photoresist which is required to be flowable after patterning in order to effectively mask regions of an irregular surface not to be removed. U.S. Pat. No. 4,070,501 to V. R. Corbin et al, issued Jan. 24, 1978, is also of interest as it teaches a method for etching via holes in dielectric layers which relies on a surface irregularity to define an aperture in a first light insensitive layer of polymer which has been previously etched to expose only higher portions of the irregular surface.

SUMMARY OF THE INVENTION

Accordingly, it is an object of this invention to provide improvements in techniques for reducing parasitic capacitance in semiconductor devices.

A further object is to provide a photolithographic process for the reduction in parasitic capacitance in semiconductor integrated circuits by the selective removal of substantial capacitive elements passing over buried conductive signal carrying lines.

Briefly, the invention accomplishes the above objects by providing a relatively thick masking material over a non-planar layered surface such that the top surface of the masking material is substantially planar. A substractive process such as etching or the development of a photoresist is carried out to uniformly remove equal thicknesses of the masking material over the area to be selectively removed until raised portions on the surface are exposed. A selective removal process such as etching is then carried out to remove at least one layer of material as defined by exposed areas through the masking material. The process is particularly useful in a process for manufacturing semiconductor memory circuits in which irregularities in a surface are formed by conductive layers which pass over diffused lines formed within a semiconductor substrate. Although the process requires the addition of an extra photolithographic step, the step is not critical to considerations such as density of components since no critical alignment tolerances are involved, nor is selective exposure of the photoresist required, as the process provides self-alignment with respect to the raised portions of the device which are to be removed.

These and other objects, features and advantages of the invention will be apparent from the following more particular description of the preferred embodiment of the invention as illustrated in the accompanying drawing.

BRIEF DESCRIPTION OF THE DRAWINGS

FIG. 7 shows the exposed portion of underlying conductive layer which is to be removed. FIGS. 8 and 9 show the structure after etching of the conductor (FIG. 8) and after removal of the photoresist (FIG. 9). FIGS. 10 and 11 show the structure after additional processing steps in accordance with the prior art process.

DESCRIPTION OF THE PREFERRED EMBODIMENT

Figure 1:
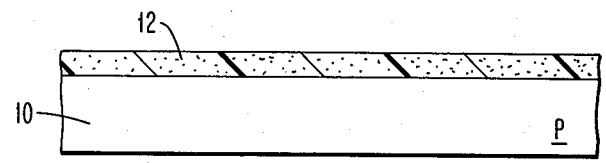
FIGS. 1 through 5 are cross-sectional schematic representations of a semiconductor substrate at various initial stages of processing as taught by the prior art process for producing a dynamic memory element.

Referring to FIG. 1, a semiconductor substrate 10, preferably p-type silicon having a resistivity of from about 2 to 12 ohm-centimeters, is provided with a layer of arsenic doped oxide by exposing substrate 10 to a chemical vapor deposition (CVD) atmosphere of gaseous silane, arsine oxygen and nitrogen in adequate proportions to provide a doped oxide layer 12 of about 3000 to 5000 Angstroms thickness which is capable of acting as a diffusion source for providing p-n junctions in substrate 10. This CVD process is best carried out at about 500° C. in an apparatus such as that described in U.S. Pat. No. 3,805,736 to R. A. Foehring et al entitled, "Apparatus for Diffusion Limited Mass Transport", issued Apr. 23, 1974.

It will be understood by those skilled in the art that various cleaning, inspection and testing procedures may be utilized both prior to and after each of the major processing steps in the manufacturing process. Such cleaning procedures as acid dips, deionized water rinses, and gaseous drying steps are normally implemented to a more or less extent depending upon the sensitivity of the product to various sources of contamination in the manufacturing process. In addition, depending upon the type of devices being manufactured, various additional steps may be included in the process sequence. For example, when fabricating dynamic memory circuits as described herein it may be desirable to provide gettering in the semiconductor substrate as described in the article, "Gettering by Ion Implantation", J. B. Dinklage et al, *IBM Technical Disclosure Bulletin,* Apr. 1977, page 4091, to reduce leakage currents caused by various defect centers present or created in the substrate during processing.

Figure 2:
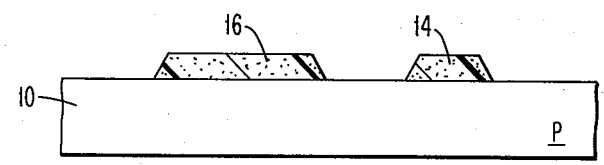

After the deposition of doped oxide layer 12 a photolithographic masking step is carried out to define all of the regions on the top surface of substrate 10 where diffused junctions are desired. Doped oxide layer 12 is then etched by a wet etch technique, for example, in hydrofluoric acid buffered with ammonium fluoride. After the protective photoresist mask is removed, doped oxide regions 14 and 16 remain on the surface of substrate 10 as shown in FIG. 2. Although a very large number of doped regions are normally formed in a single substrate, only two are illustrated, as the portion of an integrated circuit substrate as shown in the figure is adequate to describe the subject invention. Region 14 is actually an extensive line which runs perpendicular to the plane of the paper and corresponds to a bit sense line while region 16 corresponds to an isolated capacitor region, one of many located adjacent to region 14.

Figure 3:
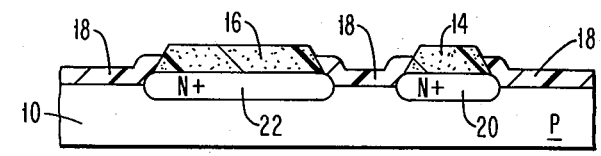

Following the definition of regions 14 and 16, the substrate is placed in an oxidation/drive in atmosphere, such as provided by the apparatus described in U.S. Pat. No. 3,790,404 to R. R. Garnache et al, entitled, "Continuous Vapor Processing Apparatus and Method", issued Feb. 5, 1974. This step, preferably carried out at about 1100° C. in an atmosphere containing oxygen and about 1 to 3 percent hydrogen chloride, causes a thermal silicon dioxide layer 18 to be formed on the substrate surface not covered by doped oxide regions 14 and 16 and causes arsenic in the doped oxide regions to diffuse into substrate 10 to form N+ regions 20 and 22 which represent the diffused bit sense line and storage nodes, respectively, of a single FET/capacitor memory cell, as shown in FIG. 3.

Figure 4:
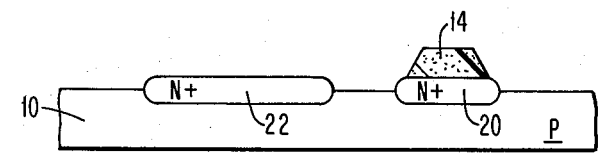

Subsequent to the drive in step, a non-critical blocking mask, not shown, is applied which is patterned to allow selective removal of doped oxide over diffusions which are subsequently required to be capacitively coupled to overlying conductors. The blocking mask is removed and a dip etch is performed to remove any residual thermal oxide 18 previously located under the blocking mask adjacent to retained doped oxide region 14, as taught in U.S. Pat. No. 3,975,220 to R. M. Quinn et al, entitled, "Diffusion Control for Controlling Parasitic Capacitor Effects in Single FET Structure Arrays", issued Aug. 17, 1976. FIG. 4 illustrates the result of this step. In order to reduce the effective bit sense line capacitance doped oxide region 14 is retained over the bit sense line diffusion 20.

Figure 5:
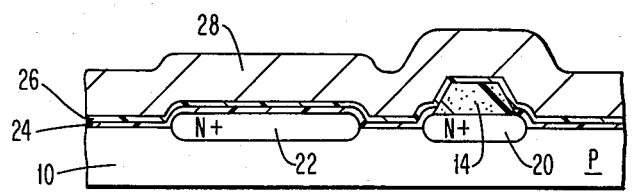

Next, as shown in FIG. 5, a thin thermal silicon dioxide layer 24 of about 300 Angstroms is grown in an oxygen/hydrogen chloride atmosphere at about 1000° C. Layer 24 covers all of the exposed wafer surface except where doped oxide is present. This step may also be carried out in an apparatus of the type described in U.S. Pat. No. 3,790,404. A layer of silicon nitride 26 is next deposited from an atmosphere of silane and ammonia at about 900° C. to provide about 200 Angstroms thickness. Deposition of nitride layer 26 is followed by the deposition of a layer of about 3000 Angstroms of boron doped polysilicon 28 from an atmosphere of hydrogen, silane, and boron hydride at about 600° C. These last two deposition steps may be carried out sequentially in a single tool as described in U.S. Pat. No. 3,805,736.

As can be seen in FIG. 5, doped polysilicon layer 28, subsequently to be defined to form a field shield, passes over doped oxide covered bit line diffusion 20 and is capacitively coupled thereto. In the prior art methods of U.S. Pat. Nos. 3,841,926 and 3,975,220 the memory cell was completed at this point in the process by etching away the polysilicon layer 28 which lies over the substrate between diffused regions 20 and 22, oxidizing layer 28 and then depositing an aluminum word line conductor over the oxidized surface. Portions of oxidized polysilicon layer 28 remained over the storage node diffusion 22 to provide one plate of the storage capacitor for the cell where it overlies diffusion 22 and to provide a field shield where it overlies the substrate surrounding diffusion 22. Another portion of layer 28 remained over bit sense line diffusion 20 along its entire length, thus contributing a substantial coupling capacitance despite the effective reduction in capacitance achieved by increasing the distance between the capacitor plates, diffusion 20 and polysilicon conductor 28, by retaining doped oxide region 14.

According to the present invention portions of polysilicon layer 28 are removed by a non-critical photolithographic etching technique which substantially reduces the effective capacitance of the bit sense lines in an array of memory cells.

Figure 6:
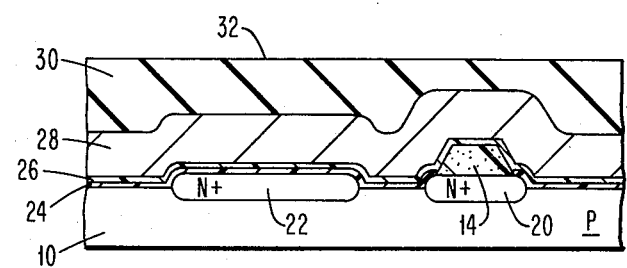
FIGS. 6 through 11 are additional cross-sectional schematic representations of a semiconductor substrate at various stages of processing in accordance with the invention and illustrate, in FIG. 6, the application of a self-leveling photoresist layer to the structure of FIG. 5.

Subsequent to the deposition of polysilicon layer 28, a relatively thick photoresist masking layer 30 is applied to the substrate. The thickness of layer 30 is such that it entirely covers all of layer 28 and forms a substantially planar surface as shown in FIG. 6. A commonly used positive photoresist suitable for layer 30 is AZ1350J, a product of the Shipley Company, Newton, Mass. AZ1350J is a light sensitive polymer consisting of an m-cresol formaldehyde novolak resin and a diazo ketone sensitizer dissolved in ethylene-glycol-monoethylether acetate, and may contain an adhesion promoter such as those described in U.S. Pat. No. 3,827,908 to C. Johnson, Jr., et al, entitled, "Method for Improving Photoresist Adherence", issued Aug. 6, 1974. The photoresist may be applied by any convenient technique which allows sufficient material to be retained on the surface of the substrate to provide a substantially planar surface. The resist is then cured by baking at about 95° C. for a sufficient time to allow the resist to harden.

Figure 7:
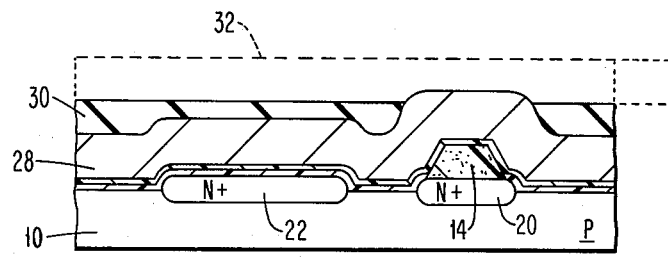
Figure 8:
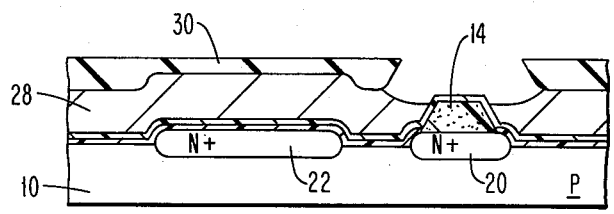

Next, photoresist layer 30 is partially removed to a uniform depth L from the original surface 32 to expose only the portions of polysilicon layer 28 which pass over retained doped oxide regions 14 as shown in FIG. 7. The technique used to remove the upper surface of layer 30 is not critical, as long as the rate of removal allows termination of the process after the depth L has been reached. A mask is not required as it is preferred to remove photoresist from the entire substrate area, although blocking masks may be utilized over some raised portions of layer 28 which are desired to be retained. Suitable removal techniques include: blanket exposure of photoresist layer 30 to a depth L such that a standard developer can be used to remove the exposed layer; uniform blanket exposure of photoresist through a neutral density filter to reduce the development rate sufficiently to control development to depth L (see, for example, U.S. Pat. No. 3,649,393 to Hatzakis, entitled, "Variable Depth Etching of Film Layers Using Variable Exposures of Photoresists", issued Mar. 14, 1972); uniform removal of unexposed photoresist layer 28 by a solvent developer such as a phosphoric acid containing potassium permanganate (see U.S. Pat. No. 4,089,766 to G. Paal et al, entitled, "Method of Passivating and Planarizing a Metallization Pattern", issued May 16, 1978); removal by a reactive ion etching or a sputtering process. Since a uniform layer of photoresist is removed the process is self-aligning and selectively exposes only those portions of the coated substrate which project through the remaining photoresist masking layer as shown in FIG. 7.

After removing a portion of photoresist layer 30 exposed polysilicon is then etched selectively by a suitable etchant, for example, by a solution of nitric acid, water and buffered hydrofluoric acid in a volumetric ratio of 7:4:1 and where the buffered hydrofluoric acid comprises 5 parts 40% ammonium fluoride 1 part 48% hydrofluoric acid by volume. This step is effective to remove substantially all of the polysilicon layer 28 which overlies the bit sense line diffusion 20 and effectively eliminates a large portion of the potential parasitic capacitive coupling between the relatively long bit sense line diffusion and the proximate portions of conductive layer 28.

Figure 9:
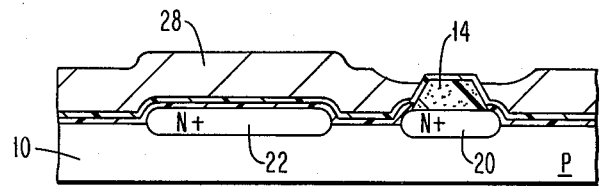

Following the self-aligned etching of layer 28, remaining portions of photoresist layer 30 are removed by conventional photoresist stripping techniques, such as with n-methylpyrollidone. This step, see FIG. 9, leaves the substrate at the same point in the process as shown in FIG. 5 with the exception that the conductive polysilicon layer 28 has been removed from selected regions, particularly over bit sense line diffusion 20, overlying retained doped oxide 14.

Figure 10:
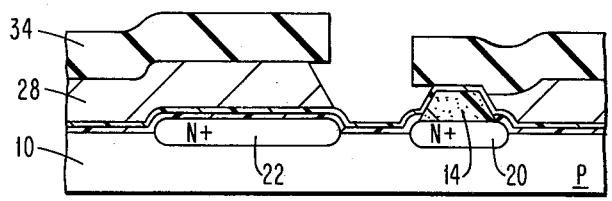

Thereafter, the process continues substantially as described in U.S. Pat. No. 3,841,926 as follows. After stripping self-aligning photoresist layer 30 another photolithographic step is used to etch portions of polysilicon layer 28 where MOSFET gate regions are required as shown in FIG. 10. It should be noted that, as shown in the figures, although this step appears to extend the previously etched regions in layer 28 it in fact is limited to relatively small area gate regions enabling each of a plurality of isolated storage node regions 22 to be coupled to the extensive bit line diffusion 20. Slight misalignment in the photomask 34 required for etching the gate regions does not substantially effect the capacitance of the bit sense lines while misalignment of a mask for removing polysilicon layer 28 over doped oxide regions 14 would provide unacceptably large variations in bit line capacitance from chip to chip and, thus, produce memory arrays having variable performance.

Figure 11:
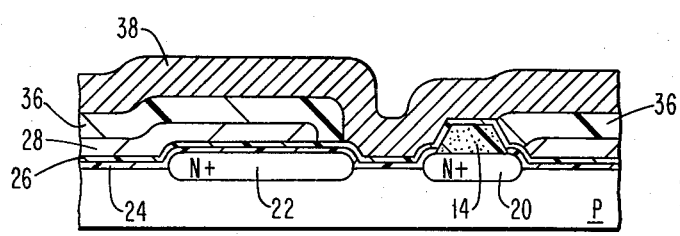

Following the definition of the gate regions, remaining portions of polysilicon layer 28 are thermally oxidized at about 1000° C. in an oxygen/hydrogen chloride atmosphere to provide silicon dioxide layer 36. This oxidation step further reduces the extent of the capacitive coupling between polysilicon layer 28 and bit sense line diffusion 20, as shown on the right of FIG. 11, as the oxidation reduces both the thickness and lateral extent of layer 28.

Finally, a conductive metallurgy layer 38 such as copper-doped aluminum is evaporated, preferably by a lift-off, or shadowing, technique to provide gate electrodes and conductive word lines. Although fabrication of the memory array requires additional passivation and conductive layers to become fully useful as a memory, after deposition of aluminum layer 38 memory cells, comprising bit sense line diffusions 20, gate electrodes 38, storage nodes 22 and capacitor plates (the portion of layer 28 overlying diffusions 22), are fully functional and may be tested. Isolation between adjacent storage nodes 22 is provided by placing a reference potential on polysilicon layer 28 such that the surface of substrate 10 adjacent to each of regions 20 and 22 but not under electrode 38 between these regions is permanently biased to be non-conductive. This can be accomplished by connecting both substrate 10 and polysilicon layer 28 to a source of negative voltage.

Although the invention has been described in connection with a single preferred embodiment, those skilled in the art will recognize that surface irregularities, such as the raised portions of layer 28, can be planarized by the sequence of steps illustrated above with respect to FIGS. 6–9. That is, by covering the irregular surface with a masking material, for example, a photoresist, uniformly removing the uppermost portion of the masking material until raised portions desired to be removed are exposed, selectively removing exposed areas of the surface and then removing the remainder of the masking material.

While the invention has been particularly shown and described with reference to a preferred embodiment thereof, it will be understood by those skilled in the art that various further changes in the form and details may be made therein without departing from the spirit and scope of the invention.

What is claimed is:

1. A method of reducing the capacitance between a conductive region of a semiconductor substrate and an overlying conductive layer comprising the steps of:
   providing a semiconductor substrate having a conductive region on one surface thereof; said substrate having a dielectrically insulated conductive layer on said surface, the conductive layer being spaced farther from said surface over at least a portion of said conductive region than over adjacent portions of said surface;
   applying a layer of masking material over said conductive layer to provide a substantially planar upper surface of said masking material;
   uniformly removing a portion of the thickness of said layer of masking material to a depth sufficient to expose only that portion of said conductive layer which lies over said portion of said conductive region of said substrate; and
   selectively removing said conductive layer where exposed.

2. The method of claim 1 wherein said masking material comprises an organic polymer material.

3. The method of claim 2 wherein said polymer comprises a photosensitive material.

4. The method of claim 3 wherein said step of uniformly removing said masking material is carried out by depthwise exposure of said masking material to a depth greater than the distance between the upper surface of said masking material and the highest portions of said conductive layer and thereafter removing said exposed portion of said masking material by a chemical developer to expose said portion of said conductive layer.

5. The method of claim 2 wherein said masking layer is uniformly removed by etching.

6. The method of claim 5 wherein etching is carried out by reactive ion etching.

7. The method of claim 1 wherein said conductive layer comprises doped polysilicon spaced from said substrate by a dielectric layer comprising a doped oxide from which said conductive region had previously been diffused.

8. The method of claim 7 wherein said semiconductor substrate includes additional conductive regions in said one surface, said polysilicon being spaced therefrom by a relatively thin dielectric layer compared with said doped oxide layer.

9. A method of making a semiconductor memory device comprising the steps of:
   providing a semiconductor substrate of a first conductivity type;
   depositing a first dielectric layer containing a second conductivity type dopant on a surface of said substrate and patterning said dielectric layer to define at least two regions of said substrate in which conductive regions of opposite conductivity type are desired;
   causing said second conductivity type dopant to diffuse from said patterned dielectric layer to form at least two regions of said second conductivity type in said substrate;
   selectively removing at least some of said patterned layer from said substrate, while retaining at least some of said patterned layer;
   providing a second dielectric layer over at least those regions of said substrate not containing retained regions of said patterned layer, said second dielectric layer being thinner than said first dielectric layer;
   providing a conductive layer of substantially uniform thickness over said first and second dielectric layers;
   applying a masking layer over said conductive layer having a substantially planar upper surface;
   uniformly removing a portion of the thickness of said masking layer to a depth sufficient to expose only said conductive layer where said conductive layer lies over said first dielectric layer; and
   selectively removing exposed portions of said conductive layer.

10. The method of claim 9 wherein said opposite conductivity regions under retained regions of said patterned first dielectric layer correspond to bit sense lines of a memory array circuit and wherein said conductive layer comprises polysilicon.

* * * * *